United States Patent
Neuhauser

(10) Patent No.: US 9,804,195 B2
(45) Date of Patent: Oct. 31, 2017

(54) HF MEASURING PROBE CONTACTING ASSEMBLY

(71) Applicant: ROSENBERGER HOCHFREQUENZTECHNIK GMBH & CO. KG, Fridolfing (DE)

(72) Inventor: Roland Neuhauser, Fridolfing (DE)

(73) Assignee: Rosenberger Hochrequenztechnik GmbH & Co. KG, Fridolfring (DE)

(*) Notice: Subject to any disclaimer, the term of this patent is extended or adjusted under 35 U.S.C. 154(b) by 0 days.

(21) Appl. No.: 15/126,897

(22) PCT Filed: Jan. 13, 2015

(86) PCT No.: PCT/EP2015/000044
§ 371 (c)(1),
(2) Date: Sep. 16, 2016

(87) PCT Pub. No.: WO2015/149893
PCT Pub. Date: Oct. 8, 2015

(65) Prior Publication Data
US 2017/0153274 A1    Jun. 1, 2017

(30) Foreign Application Priority Data
Apr. 1, 2014 (DE) .................. 20 2014 002 841

(51) Int. Cl.
*G01R 1/067* (2006.01)
*G01R 15/14* (2006.01)

(52) U.S. Cl.
CPC ......... *G01R 1/06772* (2013.01); *G01R 15/14* (2013.01)

(58) Field of Classification Search
CPC ...... H01R 13/26; H01R 43/16; H01R 12/585; H01R 12/716; H01R 12/724;
(Continued)

(56) References Cited

U.S. PATENT DOCUMENTS 4,697,143 A * 9/1987 Lockwood ......... G01R 1/06772
324/750.27
5,561,378 A * 10/1996 Bockelman ........ G01R 1/06772
324/754.07
(Continued)

FOREIGN PATENT DOCUMENTS

DE    19945178    7/2004
DE    69822818 T2    2/2005
(Continued)

OTHER PUBLICATIONS

Wu, K., Deslandes, D. and Cassivi, Y.: Impedance Transformers and Matching Networks, Encyclopedia of RF and Microwave Engineering, Apr. 15, 2005, XP002737432, the whole document.

*Primary Examiner* — Vinh Nguyen
(74) *Attorney, Agent, or Firm* — DeLio, Peterson & Curcio, LLC.; Robert Curcio

(57) ABSTRACT

A contacting assembly, in particular an HF measuring tip, having a carrier, on which a conductor structure is arranged, wherein the conductor structure has, at a contact end, at least one contact element protruding from the carrier for electrically contacting at least one contact point of a test specimen, and wherein the conductor structure has at least one impedance converter, wherein the impedance converter has a conductor segment having a gradually tapered or expanding cross-section.

19 Claims, 2 Drawing Sheets

(58) Field of Classification Search
CPC .. H01R 13/518; H01R 2103/00; G01R 1/067; G01R 1/06711; G01R 1/06772; G01R 1/24; G01R 31/255; G01R 31/311; G01R 33/302; G01R 33/34092; G01R 33/3415; G01R 33/3628; G01R 33/465; G01R 33/60; G02F 1/0316; G02F 1/0327; G02F 1/2255; G02F 2201/127; G02F 2201/16
See application file for complete search history.

(56) References Cited

U.S. PATENT DOCUMENTS

| | | | |
|---|---|---|---|
| 6,930,497 B2 * | 8/2005 | Deng | G01R 1/07357 324/72.5 |
| 7,427,868 B2 * | 9/2008 | Strid | G01R 1/06772 324/755.03 |
| 2001/0017549 A1 | 8/2001 | Inoue | |

FOREIGN PATENT DOCUMENTS

| | | |
|---|---|---|
| WO | 03012461 A1 | 2/2003 |
| WO | 03088410 A1 | 10/2003 |
| WO | 2006066676 A1 | 6/2006 |

\* cited by examiner

HF MEASURING PROBE CONTACTING ASSEMBLY

BACKGROUND OF THE INVENTION

1. Field of the Invention

The invention relates to a contacting assembly for tapping and passing on a voltage, in particular a high frequency (HF) measuring tip or HF measuring probe, comprising a carrier on which a conductor structure is arranged, wherein the conductor structure has, at a contact end, at least one contact element protruding beyond an edge of the carrier for making electrical contact with at least one contact point of a device under test, and wherein the conductor structure has at least one impedance converter or impedance transformer.

2. Description of Related Art

Conventional contacting assemblies in the form of measuring tips are known, inter alia, from the publication DE 199 45 178 C2 and from the publication WO 2006/066676. In order to test the functionality and electrical properties of devices under test, for example in the form of electronic circuits arranged on wafers, measuring tips are usually used which are placed mechanically, with projecting contact elements, onto corresponding contact points of the electronic circuit being tested. Such electronic circuits which are to be tested also generate or process high frequency signals, so that the measuring tip also needs to take into account a corresponding (wave) impedance or characteristic impedance. In other words the measuring tip must display, at its contact end, an impedance adapted to the tested electronic circuit of the device under test, since otherwise, in the event of a mismatch, as is generally known, reflections can result which can influence a measurement result adversely or make a measurement impossible.

However, if a coaxial cable or a circuit with a specified impedance of for example 50Ω or another connecting element with specified impedance is connected at a connection end of the conductor structure opposite the contact end of the conductor structure for further transmission of the signals or voltages picked up from the device under test, it can be necessary to integrate an impedance converter in the conductor structure on the carrier, so that the measuring tip can be used to measure a device under test with different impedance without undesired reflections.

A passive component such as an RF transformer or another surface-mounted device (SMD) can be used as such an impedance converter. However, such an impedance converter can only be used for impedance transformation over a limited frequency range. If the HF signals originating from the device under test and passed through the measuring tip lie outside of this frequency band, undesired reflections are generated by the impedance converter.

WO 03/012461 A1 discloses a measuring arrangement for high frequency measurements using several measuring probes to make contact with conductor structures on wafers and similar. The measuring probes comprise free-floating coplanar contact tips which are fixed by means of at least one carrier in the vicinity of their contact end such that they have a fixed position relative to one another. The measuring arrangement according to WO 03/012461 A1 also has a conductor segment with narrowing or widening cross section designed in the form of an impedance transformer.

SUMMARY OF THE INVENTION

In view of the problems described, it is the object of the present invention to provide a contacting assembly such as an HF measuring tip which passes on the signals which are to be measured free of reflection, also over a broad frequency band, and which is particularly flexible in use.

This problem is solved according to the invention through a contacting assembly according to independent claims. Advantageous further developments of the invention are described in the dependent claims.

The above and other objects, which will be apparent to those skilled in the art, are achieved in the present invention which is directed to a contacting assembly forming a HF measuring tip, comprising: a carrier on which a conductor structure is arranged; the conductor structure including, at a contact end, at least five contact elements projecting from the carrier for making electrical contact with at least one contact point of a device under test, and wherein the conductor structure has an impedance converter, wherein the impedance converter has a conductor segment with gradually narrowing or widening cross section, wherein, of the projecting contact elements, two of the at least five contact elements in the form of ground contact elements are connected with a ground conductor arranged on the carrier and three remaining contact elements are connected with the conductor segment, wherein the ground conductor runs, starting out from the contact end, to a connection end, and wherein the contact elements projecting from the carrier are alternatingly connected, electrically, with the ground conductor and with the conductor segment.

The conductor segment may be a conductor trace with gradually reducing or increasing width applied to a dielectric, and having the aforementioned impedance converter comprise a Klopfenstein structure.

At least in sections, the conductor segment may run in curves in the form of a meander or in a serpentine path, or the conductor segment may in a substantially linear path, which preferably extends over more than 50%, or over 80% or more of the dimension of the carrier.

The impedance converter may be configured for impedance transformation over a frequency band from about 700 MHz to about 2.7 GHz, or from about 500 MHz to about 3 GHz, or from about 400 MHz to about 10 GHz, or from about 300 MHz to about 20 GHz.

A ratio between the input impedance and the output impedance of the impedance converter and/or the conductor structure is preferably of the relation 5:1, 1:5, 4:1, 1:4, 2:1 or 1:2.

The input impedance at the contact end of the conductor structure is about 10Ω or about 12.5Ω and/or the output impedance of the conductor structure at a connection end opposite the contact end is about 50Ω or vice versa.

At least one contact element of the at least five contact elements is a spring-biased contact finger. At least one ground conductor is formed on a surface of the carrier opposite to the conductor segment.

The conductor structure includes a connecting element such as a coaxial plug connector, on a connection end opposite the contact end, wherein preferably a ground conductor of the contact structure is connected with an outer conductor of the plug conductor and the conductor segment of the contact structure is connected electrically with an inner conductor of the plug conductor.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
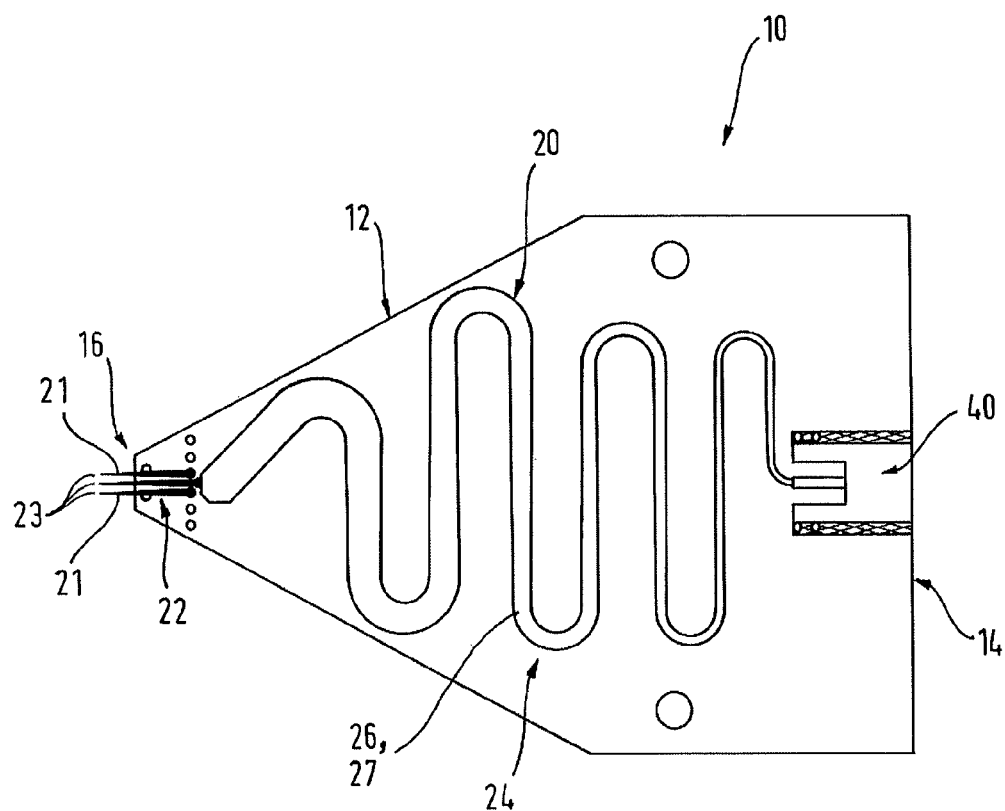
FIG. 1 shows a schematic top view of a first embodiment of a contacting assembly according to the invention in the form of an HF measuring tip for the transmission of HF signals.

In describing the preferred embodiment of the present invention, reference will be made herein to FIGS. 1-2 of the drawings in which like numerals refer to like features of the invention.

The impedance converter of the contacting assembly according to the invention is distinguished in that it has an electrical conductor segment with gradually narrowing or widening cross section.

The invention is based on the knowledge that a complex electronic component such as a balun or similar is not necessarily required for impedance transformation. Rather, in order to transform the impedance it is sufficient to use a conductor segment with a conductor cross section which changes gradually between the contact end and the connection end of the conductor structure. The length and the change in cross section of this conductor segment are designed such that the characteristic impedance of the conductor structure changes by a specified value. Since a change of the conductor cross section in steps generally leads to reflections, according to the invention the change in the conductor cross section preferably takes place gradually, preferably over a distance of more than 5 cm, particularly preferably more than 10 cm, in particular 20 cm or more.

The contacting assembly has five contact elements projecting from the carrier, of which at least two contact elements are connected with at least one ground conductor arranged on the carrier, which preferably runs from the contact end to the connection end.

As explained above, reflections can be introduced through an abruptly changing conductor cross section. An abrupt change in cross section or conductor width at the transition between the conductor trace and the narrow contact element on the contact end of the conductor structure can be reduced in that five contact elements spaced part from one another are connected electrically with the conductor trace. In other words, the conductor trace is branched in that it is connected with more than one contact element projecting from the carrier, whereby a ground contact element connected with the ground conductor can in each case be arranged between the individual signal-carrying contact elements. In this way, the width of the conductor trace can, practically, be continued at the contact end as far as the tips of the contact elements.

In this case an alternating arrangement of ground contact elements and signal-carrying contact elements increases the spacing between the individual contact elements while maintaining a low input impedance. If, for example, only one signal-carrying contact element and one ground contact element are present next to one another, the spacing between them may need to be less than 1 µm in order to maintain a low input impedance. Such a short spacing between two contact elements is difficult to manufacture and the corresponding contact elements are susceptible to damage. If, on the other hand, three or more signal-carrying contact elements project from the carrier between ground contact elements, a spacing between adjacent contact elements of more than 10 µm can be sufficient.

Preferably, the conductor structure has at least one signal conductor or voltage conductor and at least one ground conductor which each run from the contact end to the connection end, whereby a plug conductor for further transmission of the tapped signal can be arranged at the connection end of the conductor structure. The conductor segment with changing cross section is thereby preferably built into the signal conductor. The ground conductor, like the signal conductor, can be connected at the contact end with one or more contact elements projecting from the carrier for making electrical contact with at least one contact point on the device under test.

The carrier can possess a dielectric on which the conductor structure is arranged. In a particularly preferred embodiment of the invention, the carrier is in the form of a circuit board on which a part of the conductor structure is applied as a conductor trace. In this case, the conductor segment with changing cross section can be formed as a (substantially two-dimensional, i.e. planar) conductor trace with reducing or increasing width. Preferably, the signal conductor is, at least in sections, in the form of a conductor trace, while the ground conductor can be arranged on a rear side of the circuit board, for example as a surface layer of a conductive material such as a metal.

The ratio between the conductor trace width at one end of the conductor trace and the conductor trace width at the other end of the conductor trace is preferably greater than two, particularly preferably greater than three, in particular four or more. This ratio depends on the impedance transformation which is to be achieved.

A reliable impedance transformation to a specified input and/or output impedance of the conductor structure which can be achieved using simple means can be achieved in that the impedance converter displays a Klopfenstein structure or a "Klopfenstein taper". Using a Klopfenstein taper, two different specified characteristic impedance levels are connected with one another through a conductor segment with narrowing cross section over a short distance while at the same time minimizing reflections. Using a Klopfenstein structure, it is possible to achieve an impedance transformation over a particularly broad HF frequency band without interfering reflections.

A particularly compact and economically manufactured contacting assembly can be provided in that, at least in sections, the conductor segment runs in curves, in particular in the form of a meander, from the connection end in the direction of the contact end. In other words, the narrowing conductor segment runs in a serpentine path, preferably with several, particularly preferably more than five, in particular seven or more curving sections in which the direction of the conductor segments changes by around 180°. In this way, a conductor length of for example more than 30 cm can be applied to an area of the carrier with a length of for example less than 10 cm. In other words, the ratio between the length of the conductor segment and the longitudinal dimension of the carrier section on which the conductor segment is arranged is three or more. The contacting assembly according to the invention can be manufactured in a particularly simple manner in that a serpentine conductor segment is printed onto or otherwise applied to a circuit board in the form of a conductor trace.

Alternatively, the narrowing conductor segment can also be applied to the carrier in linear form, i.e. without curves or bends. In order, nonetheless, to arrive at a comparatively compact contacting assembly, it has proved advantageous for the conductor segment to extend, preferably in the form a conductor trace, over more than 50%, preferably over more than 80%, in particular over the entire dimension of the carrier, from the contact end to the connection end. This dimension can, advantageously, be more than 6 cm and less than 20 cm, in particular between 10 and 15 cm. Unlike a curving conductor segment, with a linear conductor segment there is no danger of a crosstalk between individual conductor loops.

It has been found that an impedance converter with a Klopfenstein taper can be configured for impedance transformation over a particularly broad frequency range from around 700 MHz to around 2.7 GHz, preferably from 500 MHz to 3 GHz, particularly preferably from 400 MHz to 10 GHz, in particular from 300 MHz to 20 GHz, whereby the reflection factor Γ over the entire frequency range is less than 0.2, in particular less than 0.1.

In view of the usual input impedances of HF components and HF cables, in particular coaxial cables, it has proved practical for the ratio between the input impedance and the output impedance of the impedance converter or the conductor structure to be set to 5:1, 1:5, 4:1, 1:4, 2:1 or 1:2. The output impedance of the conductor structure is understood to mean the impedance of the conductor structure at the connection end between the signal conductor containing the conductor segment and a ground conductor (connection impedance). The input impedance of the conductor structure is understood to mean the contact-side impedance of the conductor structure between the contact element connected with the conductor segment and a contact element connected with the ground conductor, which is adapted to the wave impedance of the device under test which is to be measured.

The contact-side impedance of the conductor structure is thereby preferably around 10Ω or around 12.5Ω and/or the connection impedance of the conductor structure is around 50Ω or vice versa. In this case a conventional coaxial cable can be connected to the connection end of the contacting assembly.

With a view to achieving a reliable contact with the at least one contact point on the device under test without the risk of damage to the device under test or contact element it has proved practical for the at least one contact element to be a preferably spring-biased contact finger. Preferably, all contact elements including the ground contact elements connected with the ground conductor are designed as spring-biased contact fingers.

The several contact elements, projecting beyond an edge of the carrier in the manner of contact springs, can be in a coplanar arrangement, so that they are set up to make contact with coplanar contact points on the device under test. Preferably, two outer contact elements are ground elements which are connected with the ground conductor, while a middle contact element is connected with the signal conductor which contains the narrowing conductor segment. The spacing between and length of the contact elements are designed such that a specified wave impedance results at the contact end which is matched to the wave impedance of the device under test.

The at least one ground conductor can be arranged on the surface of the carrier facing away from the surface carrying the conductor segment. It can be in the form of a metallic coating or layer which covers a rear side of the carrier. Alternatively or in addition, a shielding of the signal conductor of the conductor structure can be provided.

In order to reduce a signal reflection introduced through the contacting assembly it has proved practical for the contact elements projecting from the carrier to be alternatingly connected, electrically, with the ground conductor and with the conductor segment. Such a contact element structure can be described as a GSG structure (Ground-Signal-Ground).

Preferably, the two outer contact elements are ground contact elements, of which preferably four or more are provided in total. On the other hand, the contact structure preferably has three or more signal-carrying contact elements connected with the conductor trace which each project between two ground contact elements.

In order to achieve an impedance-adapted and stable coupling of the contacting assembly according to the invention to a connection element such as a cable or an electronic circuit, the conductor structure can have a connecting element such as a plug conductor, in particular a coaxial plug connector, on a connection end opposite the contact end, whereby preferably a ground conductor of the contact structure is connected with an outer conductor of the plug conductor and/or the conductor segment of the contact structure is connected with an inner conductor of the plug conductor.

With regard to the arrangement of the contact elements on the carrier as well as with regard to the connecting elements and the connection between the contact elements and the connecting elements, reference is made to the publication WO 2006/066676 A1, the content of which is included in the present disclosure by way of reference.

The embodiment, shown in FIG. 1, of a contacting assembly according to the invention 10 for the transmission of electrical signals in the form of a measuring tip for the measurement of devices under test with high frequency-circuits, for example on semiconductor wafers, comprises a carrier 12 with a circuit board which, starting out from a connection end 14, narrows gradually in the direction of a contact end 16. Arranged on the carrier 12 is a conductor structure 20 which runs from the connection end 14 to the contact end 16.

The conductor structure 20 has at least one signal conductor and at least one ground conductor, whereby the ground conductor is arranged on the rear side, not shown, of the carrier 12, while the surface of the carrier 12 carrying the signal conductor faces the viewer in the represented figure. Alternatively or in addition, the conductor structure 20 can also possess several signal conductors. Alternatively, signal and ground conductors can be arranged on the same surface of the carrier 12.

A total of three spring-biased contact elements 22 in the form of contact fingers 23 project from the contact end 16 of the carrier 12 beyond an edge of the carrier for the purpose of making contact with correspondingly-spaced contact points on the device under test. In the example shown, the middle contact finger 23 is connected with the signal conductor and the outer two contact fingers 23 are connected with the ground conductor. The outer contact fingers 23 are also ground contact elements 21. Other arrangements of the contact elements or more than three contact fingers are also conceivable.

A plug conductor 40 with an inner conductor and an outer conductor is arranged at the connection end 14 of the carrier 14. A coaxial cable or a mating plug connector can be plugged into the plug conductor 40 for further transmission of the HF signals picked up via the contact elements 22. The inner conductor of the plug conductor 40 is connected electrically with the signal conductor and thus with the middle contact finger 23, while the outer conductor of the plug conductor 40 is connected electrically with the ground conductor and thus with the two ground contact elements 21.

The conductor structure 20 has an impedance converter 24, whereby the impedance converter 24 has an electrical conductor segment 26 with a gradually widening cross section, starting out from the connection end 14 in the direction of the contact end 16. This conductor segment 26 is, in the embodiment shown, in the form of a conductor trace 27 of increasing width applied to the carrier 12. The conductor trace 27 is part of the signal conductor which runs between the middle contact finger 23 and the inner conductor of the plug conductor 40. The geometrical form and the curvature of the conductor trace 26 are designed such that a Klopfenstein structure is created for impedance transformation between the connection end 14 and the contact end 16. In the example shown, signals can be picked up from a device under test through the contact finger 22 with a wave impedance of 12.5Ω and passed on free of reflection via a coaxial cable which is connected to the plug conductor 40 with a wave impedance of 50Ω. Thus, the illustrated contacting assembly 10 as a whole represents an impedance converter in which the impedance transformation is effected by means of a Klopfenstein structure.

The contacting assembly 10 is configured to pick up and pass on HF signals over a frequency band from around 698 MHz to around 2.7 GHz without reflections occurring, whereby the impedance level is raised from 12.5Ω at the contact end 16 of the conductor structure 20 to 50Ω at the connection end of the conductor structure 20. In this example this leads to a transformation ratio of 1:4. Alternatively, the impedance level can be raised from 10Ω at the contact end 16 to 50Ω at the connection end, resulting in a transformation ratio of 1:5.

A more compact construction design of the contacting assembly 10 is possible in that the conductor trace 27 runs between the plug conductor 40 and the contact finger 23 in a serpentine path includes several curves. The width of the conductor trace 27 at the end of the conductor trace 27 facing the contact element 22 is around 4 times as great as its width at the end facing the plug conductor 40. However, the form, length and curvature of the conductor trace 40 can be adjusted accordingly depending on the impedance transformation which is to be achieved. The spacing and length of the contact elements 22 are designed such that the contact-side impedance is matched to the impedance of the component which is to be measured.

According to the invention, the impedance transformation is effected solely through the curvature of the conductor trace 27 of the signal conductor, without additional components such as SMDs being necessary. This means that the frequency band can be broader and the contacting assembly according to the invention can thus also be used to test LTE components. The installation/incorporation of an SMD component is also unnecessary. The transformation ratio of the impedance converter can be varied individually and can for example 1:5, 5:1, 1:2, 2:1, 1:4, 4:1, etc.

Figure 2:
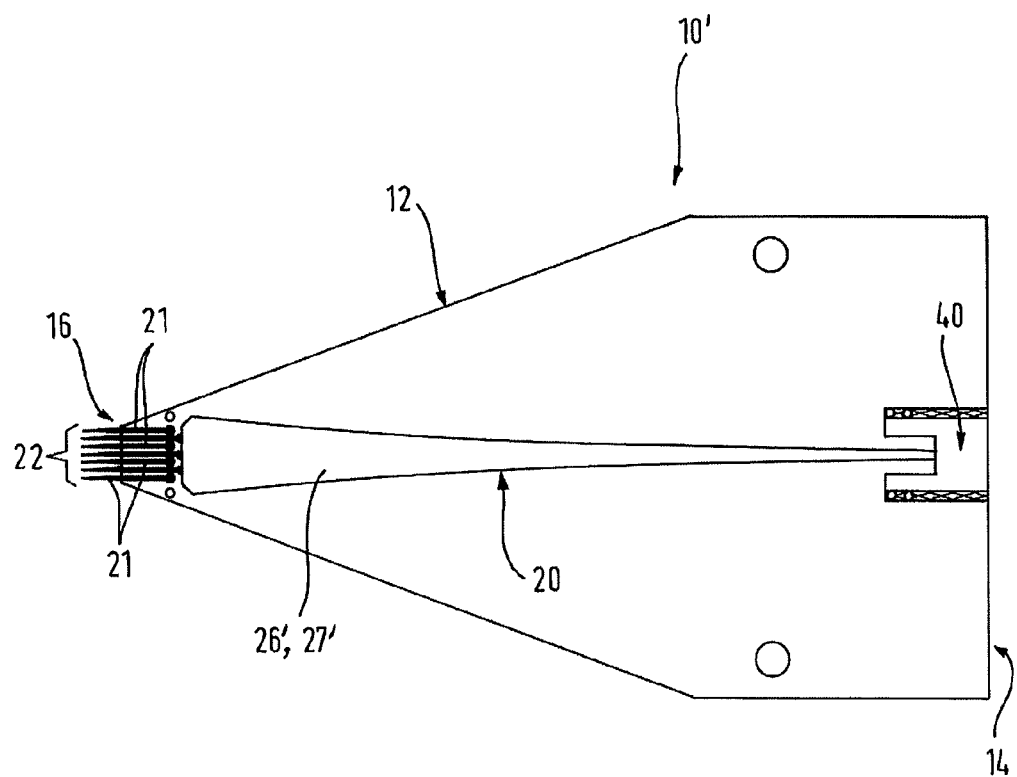
FIG. 2 shows a schematic top view of a second embodiment of a contacting assembly according to the invention.

FIG. 2 shows a second embodiment of a contacting assembly according to the invention 10'. In this second embodiment the conductor segment 26' in the form a conductor trace 27' runs, not in a serpentine path, but in a linear path starting out from the connection end 14 via the carrier 12. The total dimension of the carrier, which substantially corresponds to the length of the conductor trace 27', which narrows in the direction of the connection end 14, is around 12 cm. The straight path of the conductor segment 26' prevents a crosstalk between individual conductor loops.

Unlike the first embodiment, the conductor structure 20 has a total of seven contact elements 22 projecting beyond an edge of the carrier 12, of which four ground contact elements 21 are each connected with a (common) ground conductor on the rear side of the carrier 12 and three signal-carrying contact elements are connected with the conductor trace 27'. The ground contact elements 21 and the signal-carrying contact elements thereby alternate. The two outer contact elements 22 are ground contact elements 21. Alternatively, more or less than seven contact elements 22 are also conceivable.

The illustrated branching into several contact elements connected with the conductor segment 26' minimizes a reflection at the transition between the contact elements 22 and the (wide) end of the conductor segment 26'. The spacing between the individual contact elements 22 can also be increased in this way while maintaining the desired contact-side impedance. In the present case the spacing between two adjacent contact elements 22 is more than 10 μm and the contact-side impedance around 10Ω. The spacing between and number of the contact elements can be adjusted accordingly depending on the desired impedance transformation.

Otherwise, reference is made to the explanations relating to the first embodiment shown in FIG. 1, which apply correspondingly to the second embodiment.

LIST OF REFERENCE NUMBERS 10, 10' contacting assembly
12 carrier/circuit board
14 connection end
16 contact end
20 conductor structure
21 ground contact elements
22 contact elements
23 spring-biased contact finger
24 impedance converter
26, 26' conductor segment
27, 27' conductor trace
40 plug conductor While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A contacting assembly forming an HF measuring tip, comprising:
   a carrier on which a conductor structure is arranged;
   said conductor structure including, at a contact end, at least five contact elements projecting from the carrier for making electrical contact with at least one contact point of a device under test, and wherein the conductor structure has an impedance converter, wherein the impedance converter has a conductor segment with gradually narrowing or widening cross section, wherein, of the projecting contact elements, two of said at least five contact elements in the form of ground contact elements are connected with a ground conductor arranged on the carrier and three remaining contact elements are connected with the conductor segment, wherein the ground conductor runs, starting out from the contact end, to a connection end, and wherein the contact elements projecting from the carrier are alternatingly connected, electrically, with the ground conductor and with the conductor segment.

2. The contacting assembly of claim 1, wherein the conductor segment is a conductor trace with gradually reducing or increasing width applied to a dielectric.

3. The contacting assembly of claim 2 wherein said dielectric includes a circuit board.

4. The contacting assembly of claim 2, wherein the impedance converter comprises a Klopfenstein structure.

5. The contacting assembly of claim 4, wherein at least in sections, the conductor segment runs in curves in the form of a meander or in a serpentine path.

6. The contacting assembly of claim 2, wherein the conductor segment runs in a substantially linear path and preferably extends over more than 50%, or over 80% or more of the dimension of the carrier.

7. The contacting assembly of claim 2, wherein the impedance converter is configured for impedance transformation over a frequency band from about 700 MHz to about 2.7 GHz, or from about 500 MHz to about 3 GHz, or from about 400 MHz to about 10 GHz, or from about 300 MHz to about 20 GHz.

8. The contacting assembly of claim 7, wherein a ratio between the input impedance and the output impedance of the impedance converter, or a ratio between the input impedance and the output impedance of the conductor structure, or both, is of the relation 5:1, 1:5, 4:1, 1:4, 2:1 or 1:2.

9. The contacting assembly of claim 2, wherein at least one contact element of said at least five contact elements is a spring-biased contact finger.

10. The contacting assembly of claim 2, wherein the at least one ground conductor is formed on a surface of the carrier opposite to the conductor segment.

11. The contacting assembly of claim 1, wherein the impedance converter comprises a Klopfenstein structure.

12. The contacting assembly of claim 1, wherein at least in sections, the conductor segment runs in curves in the form of a meander or in a serpentine path.

13. The contacting assembly of claim 1, wherein the conductor segment runs in a substantially linear path and preferably extends over more than 50%, or over 80% or more of the dimension of the carrier.

14. The contacting assembly of claim 1, wherein the impedance converter is configured for impedance transformation over a frequency band from about 700 MHz to about 2.7 GHz, or from about 500 MHz to about 3 GHz, or from about 400 MHz to about 10 GHz, or from about 300 MHz to about 20 GHz.

15. The contacting assembly of claim 14, wherein at least one of the input impedance at the contact end of the conductor structure is about 10Ω or about 12.5Ω, and the output impedance of the conductor structure at a connection end opposite the contact end is about 50Ω, or at least one of the input impedance at the contact end of the conductor structure is about 50Ω, and the output impedance of the conductor structure at a connection end opposite the contact end is about 10Ω or about 12.5 Ω.

16. The contacting assembly of claim 1, wherein a ratio between the input impedance and the output impedance of the impedance converter, or a ratio between the input impedance and the output impedance of the conductor structure, or both, is of the relation 5:1, 1:5, 4:1, 1:4, 2:1 or 1:2.

17. The contacting assembly of claim 1, wherein at least one contact element of said at least five contact elements is a spring-biased contact finger.

18. The contacting assembly of claim 1, wherein the at least one ground conductor is formed on a surface of the carrier opposite to the conductor segment.

19. The contacting assembly of claim 1, wherein the conductor structure includes a connecting element such as a coaxial plug connector, on a connection end opposite the contact end, wherein preferably a ground conductor of the contact structure is connected with an outer conductor of the plug conductor and the conductor segment of the contact structure is connected electrically with an inner conductor of the plug conductor.

* * * * *